United States Patent
Pehlke et al.

(10) Patent No.: US 7,333,778 B2
(45) Date of Patent: Feb. 19, 2008

(54) SYSTEM AND METHOD FOR CURRENT-MODE AMPLITUDE MODULATION

(75) Inventors: David R. Pehlke, Chapel Hill, NC (US); Aristotele Hadjichristos, Cary, NC (US)

(73) Assignee: Ericsson Inc., Morrisville, NC (US)

( * ) Notice: Subject to any disclaimer, the term of this patent is extended or adjusted under 35 U.S.C. 154(b) by 478 days.

(21) Appl. No.: 10/889,567

(22) Filed: Jul. 12, 2004

(65) Prior Publication Data

US 2005/0032488 A1 Feb. 10, 2005

Related U.S. Application Data

(63) Continuation-in-part of application No. 09/813,593, filed on Mar. 21, 2001, now Pat. No. 6,785,521.

(51) Int. Cl.
*H04B 1/04* (2006.01)
*H03F 3/38* (2006.01)

(52) U.S. Cl. .............. 455/114.3; 455/127.1; 455/108; 330/10

(58) Field of Classification Search ............ 330/10; 455/114.3
See application file for complete search history.

(56) References Cited

U.S. PATENT DOCUMENTS

| | | | |
|---|---|---|---|
| 4,492,926 A * | 1/1985 | Kusakabe et al. | 329/349 |
| 4,808,907 A * | 2/1989 | Main | 323/316 |
| 4,952,890 A * | 8/1990 | Swanson | 332/152 |
| 5,497,125 A * | 3/1996 | Royds | 330/290 |
| 5,880,635 A * | 3/1999 | Satoh | 330/144 |
| 6,008,698 A * | 12/1999 | Dacus et al. | 330/279 |
| 6,255,906 B1 * | 7/2001 | Eidson et al. | 330/124 R |
| 6,329,879 B1 * | 12/2001 | Maruyama et al. | 330/289 |
| 6,351,189 B1 | 2/2002 | Hirvilampi | |
| 6,407,639 B1 * | 6/2002 | Jean et al. | 330/298 |
| 6,417,734 B1 * | 7/2002 | Luo et al. | 330/296 |
| 6,437,647 B1 * | 8/2002 | Fowler | 330/288 |
| 6,566,944 B1 | 5/2003 | Pehlke et al. | |
| 6,665,525 B2 * | 12/2003 | Dent et al. | 455/108 |
| 2002/0137480 A1 | 9/2002 | Hadjichristos et al. | |
| 2003/0206064 A1 | 11/2003 | Jansen et al. | |

FOREIGN PATENT DOCUMENTS

EP 0772292 5/1997

* cited by examiner

*Primary Examiner*—Duc M. Nguyen
(74) *Attorney, Agent, or Firm*—Coats & Bennett, P.L.L.C.

(57) ABSTRACT

An amplifier circuit includes a power amplifier biased for saturated mode operation, and a controllable current source to provide supply current to the power amplifier. The controllable current source effects desired amplitude modulation of the output signal from the power amplifier by modulating the supply current it provides responsive to an amplitude information signal. In one or more embodiments, the current source includes a circuit that is configured to adjust one or more transmitter operating parameters responsive to detecting changes in the effective DC resistance of the power amplifier. For example, the circuit may generate a compensation signal that reduces the effective DC resistance responsive to detecting that the effective DC resistance has undesirably increased. By way of non-limiting examples, such compensation may be effected by changing a current mirror, an amplifier-to-antenna impedance matching, an amplifier bias or device size, or imposing some form of transmit signal back-off.

24 Claims, 14 Drawing Sheets

SYSTEM AND METHOD FOR CURRENT-MODE AMPLITUDE MODULATION

RELATED APPLICATIONS

The instant application is a continuation-in-part of U.S. patent application Ser. No. 09/813,593, which was filed on 21 Mar. 2001 now U.S. Pat No. 6,785,521, and entitled "System and Method for Current-Mode Amplitude Modulation." That priority application, which is co-pending and commonly assigned with the instant application, is incorporated herein by reference in its entirety.

BACKGROUND OF THE INVENTION

The present invention generally relates to RF power amplifiers and, in particular, relates to efficient, linear RF signal amplification.

Several existing wireless communication standards are either in use, or planned for use in the near future. Current standards that enjoy varying degrees of deployment globally include the TIA/EIA-136 and Global Services for Mobile Communications (GSM) standards, which represent competing approaches for providing wireless communication and data services. The TIA/EIA-136 and GSM standards employ Time Division Multiple Access (TDMA) techniques. Other deployed standards, based on Code Division Multiple Access techniques, include the IS-95 standard. Newer standards, including those still in development, or enjoying initial roll out, include the so-called third generation (3G) standards. The 3G standards include the North American CDMA-based IS-2000, and the primarily European Wideband CDMA (WCDMA) standards. The Enhanced Data Rates for Global Evolution (EDGE) standards provide a migration path for TDMA and GSM networks towards 3G services.

Differing approaches to transmit signal modulation exist among the various standards, but each standard typically has specifications regarding transmit signal fidelity. The spectral requirements, such as spectral purity or adjacent channel power, impose certain performance requirements on the RF transmitters used within systems based on these standards. In some cases, the spectral requirements imposed by certain of these standards are quite rigorous. For example, the EDGE extensions to GSM and TDMA standards move away from the Gaussian Minimum Shift Keying in favor of 8-PSK modulation, which has significant amplitude modulation depth as well as strict spectral purity requirements. Such requirements place significant linearity demands on the associated transmitters.

BRIEF SUMMARY OF THE INVENTION

The present invention includes a system and method for efficient, linear RF signal amplification. A power amplifier biased for saturated mode operation is powered by a controllable current source. Amplitude modulation of the output signal from the power amplifier is based on controlling its supply current in proportion to an envelope modulation signal. In this manner, the power amplifier may be configured for efficient operation in a saturated mode, while still being used to generate a transmit signal with highly linear envelope modulation. Supply current modulation provides good linearity of control across a broad range of power amplifier operating currents, and may be particularly advantageous for certain types of power amplifier devices, such as heterojunction bipolar transistor (HBT) power amplifiers.

One approach to RF transmit signal generation involves the generation of separate baseband phase and amplitude information signals. The constant envelope phase information signal may then be used to generate a phase-modulated output signal, which is then amplified by the HBT PA. In conjunction, the amplitude information signal is used to drive a lossy modulator that modulates the supply current of the HBT PA responsive to the desired amplitude information. This action modulates the envelope of the transmit signal output by the HBT PA as a function of the desired amplitude information.

The modulator may comprise a current source configured as a current mirror circuit that generates a reference current in a first leg of the mirror that is modulated under closed loop control responsive to an input amplitude information signal, and generates a modulated supply current in a second leg of the mirror. That is, the modulated supply current is generated as a scaled version of the modulated reference current. Generally, the current mirror is configured with a reference load that is sized relative to the nominal, effective DC resistance of the power amplifier such that the voltage in the first leg matches the voltage in the second leg. However, the effective DC resistance of the power amplifier can change during operation, leading to voltage imbalances in the current mirror, and potentially leading to signal clipping/distortion.

As such, one embodiment of the present invention comprises a method of compensating operation of a transmitter that includes a RF power amplifier being provided a modulated supply current. Here, the method comprises detecting a change in an effective DC resistance of the RF power amplifier, and compensating transmitter operation responsive to said detection. Detecting a change in an effective DC resistance of the RF power amplifier may comprise detecting that an operating voltage of the RF power amplifier is approaching a supply voltage limit, or may comprise detecting voltage imbalances between the current mirror legs.

Compensating for detected changes in the effective DC resistance of the power amplifier comprises, for example, making a control change to lower the effective DC resistance of the power amplifier in response to detecting that it has increased. Such compensation control may comprise, among other things, changing the bias of the power amplifier, changing the effective device size of the power amplifier, changing an impedance matching of the power amplifier, or backing off one or both the RF input to the power amplifier and the modulated supply current powering the amplifier.

Thus, an exemplary current modulation circuit for use with a RF power amplifier in a transmitter comprises a current mirror circuit configured to provide a modulated supply current to the RF power amplifier based on mirroring a reference current that is modulated responsive to an amplitude information signal, a detection circuit configured to generate a detection signal responsive to detecting changes in an effective DC resistance of the RF power amplifier, and a control circuit configured to compensate the transmitter responsive to the detection signal. The control circuit can be configured to generate an analog or digital compensation signal as needed, and as explained above, can be configured to drive transmit signal generation logic, impedance matching circuits, amplifier biasing and/or sizing control, etc.

In another exemplary embodiment, an amplifier circuit effects amplitude modulation of the RF power amplifier using a current mirror-based current source that provides amplitude modulated supply current to the power amplifier. In such embodiments, detecting a change in an effective DC resistance of the RF power amplifier may comprise comparing a first voltage drop across a first pass transistor in a reference leg of the current mirror circuit to a second voltage drop across a second pass transistor in an output leg of the current mirror circuit, wherein said first pass transistor regulates a reference current into a reference load, and wherein said second pass transistor regulates a supply current into the RF power amplifier, said supply current being a mirrored version of said reference current. In that context, compensating transmitter operation responsive to said detection may vary a drive signal to the second pass transistor under closed-loop control such that the second voltage drop is maintained substantially equal to the first voltage drop.

With these and other embodiments in mind, it should be understood that the present invention is not limited by the above exemplary information. Indeed, those skilled in the art will appreciate additional features and advantages of the present invention upon reading the following detailed discussion, and upon viewing the accompanying drawings.

DETAILED DESCRIPTION OF THE INVENTION

While the present invention contemplates usage within mobile terminals or other battery-powered RF communication devices where power amplifier efficiency and linearity are critical, it is applicable to a broad range of RF applications. It should further be noted that the present invention is related to the co-pending application entitled, "System and Method of RF Power Amplification," which is commonly assigned with the instant application. The disclosure of that co-pending application is incorporated herein by reference.

Figure 1:
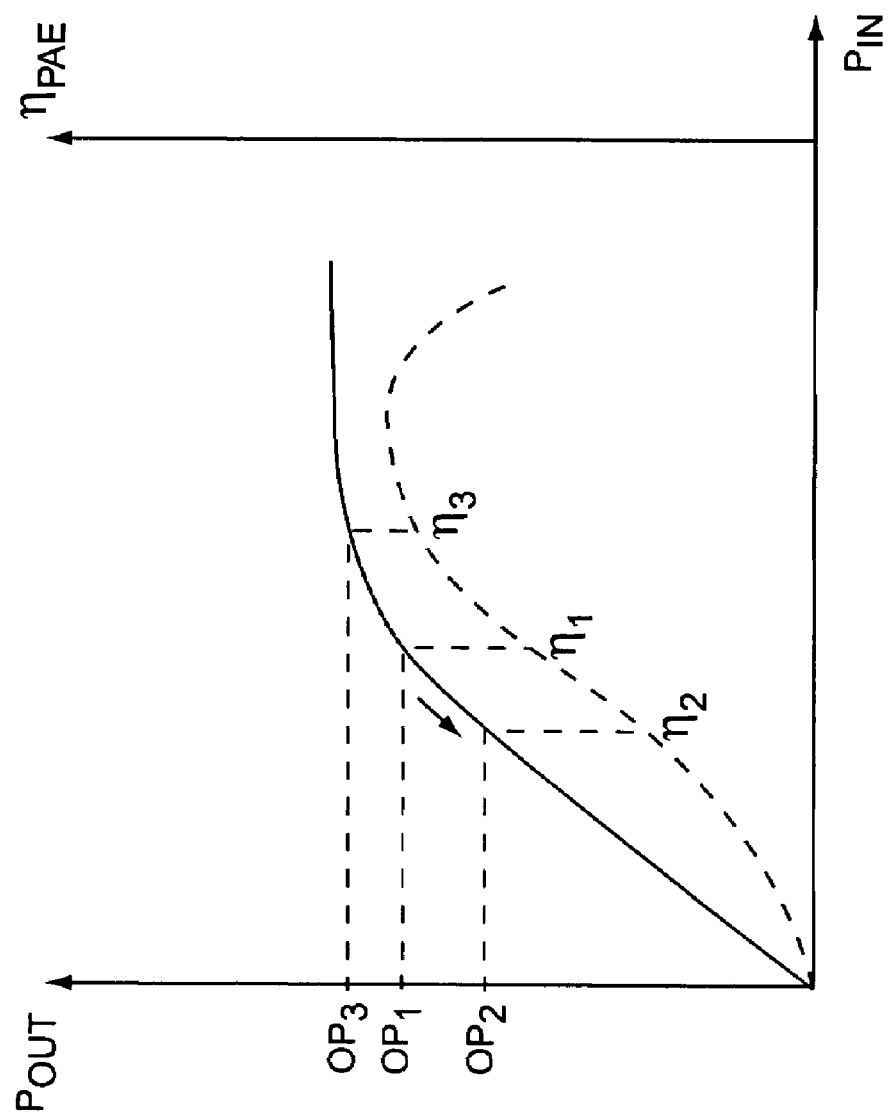
FIG. 1 is a diagram of a general power amplifier efficiency curve in relation to input and output signal power.

FIG. 1 depicts a general radio frequency output power curve for a typical power amplifier, and additionally illustrates the general relationship between the amplifier's operating point and its operating efficiency. The horizontal axis represents the RF power of the input signal $RF_{IN}$, while the left vertical axis represents the RF power of the output signal $RF_{OUT}$ generated by a radio frequency power amplifier, and the right vertical axis represents power amplifier operating efficiency ($\eta_{PAE}$). Operating point 1 ($OP_1$) on the $P_{OUT}$ vertical axis illustrates a nominal operating point that might be chosen for linear operation of the power amplifier.

$OP_1$ corresponds to an amplifier operating efficiency $\eta_1$ in linear mode operation, which may have an exemplary value in the neighborhood of forty percent. The linearity requirements of some modulation standards, such as the 8-PSK techniques used in EDGE mobile terminals, are such that $OP_1$ may significantly degrade the spectral quality at the power amplifier output. Because of this, the power amplifier may be configured for operation at operating point 2 ($OP_2$), which provides greater range for linear amplification but results in significantly poorer efficiency. An exemplary efficiency value for $OP_2$ might be in the range of thirty percent.

Operating point 3 ($OP_3$) offers significantly improved efficiency as compared to $OP_1$ and $OP_2$, but requires that the power amplifier operate in a saturated mode, where the RF output power no longer varies linearly with the RF input power. As earlier noted, some signal modulation schemes do not require linear amplification, so operation at $OP_3$ presents no problems with regard to such signal modulation schemes. However, signal modulation schemes that require linear amplification are not amenable to amplification with conventional power amplifiers operating in saturated mode.

Figure 2:
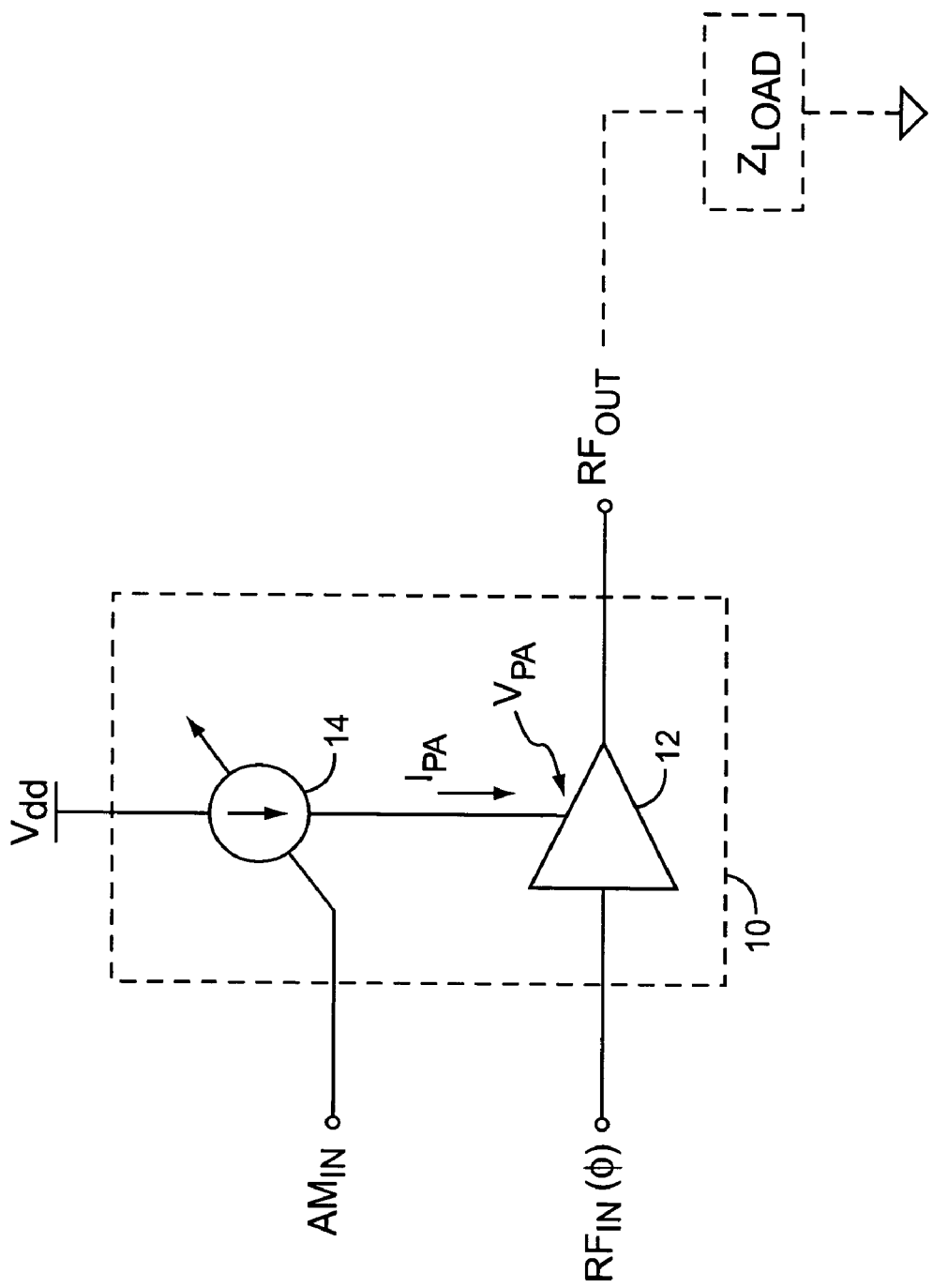
FIG. 2 is a diagram of the general amplifier circuit of the present invention.

FIG. 2 is an exemplary diagram of an amplifier circuit 10 in accordance with the present invention. The amplifier circuit 10 includes a power amplifier 12, and a lossy modulator 14. The term "lossy" applies because the lossy modulator 14 dissipates power during operation. However, in contrast to the lossy modulator of the earlier incorporated and co-pending application, the lossy modulator 14 of the present invention controls the supply current $I_{PA}$ provided to the power amplifier 12 as a function of the desired amplitude modulation information. That is, the lossy modulator 14 operates directly on the supply current of the power amplifier 12. This operation is independent of the applied voltage $V_{PA}$ within the limits of the voltage ceiling defined by the supply voltage $V_{dd}$. Thus, the lossy modulator 14 operates as a controllable current source and, for clarity, is referred to herein as the current source 14.

The power amplifier 12 may itself be a compound or multi-amplifier arrangement, and is configured for saturated mode operation. While not shown, the power amplifier 12 may include filtering circuitry between its supply input and the corresponding current source 14. Essentially, this filtering circuitry would suppress any RF frequencies present on its supply input and may simply comprise a shunt capacitor and/or RF choke. Note that the output capacitance of the current source 14 may itself effectively suppress unwanted RF frequencies on the supply input of the power amplifier 12, and obviate the need for supplemental filtering.

The power amplifier 12 receives a constant-envelope RF input signal, $RF_{IN}$, which it amplifies to produce the transmit signal, $RF_{OUT}$. The current source 14 imparts desired amplitude modulation to the otherwise constant-envelope transmit signal $RF_{OUT}$ by modulating the supply current used to power the power amplifier 12 in accordance with an amplitude information signal $AM_{IN}$. The amplitude information signal $AM_{IN}$ corresponds to the amplitude modulation desired for the transmit signal $RF_{OUT}$.

Commonly, the transmit signal $RF_{OUT}$ conveys desired information based on a combination of synchronized phase and amplitude modulation of the transmit signal. Thus, the input signal $RF_{IN}$ might be a constant-envelope phase-modulated signal, with the amplitude information signal $AM_{IN}$ being a corresponding, synchronized amplitude modulation signal. General methods for creating such signals are discussed later when the amplifier circuit 10 is presented in the context of a larger system, such as a mobile terminal.

Because the RF input signal $RF_{IN}$ is a constant-envelope signal, the power amplifier 12 is not required to respond to linear amplitude variations on its signal input. However, the supply current modulation provided by the current source 14 provides a way to impart very linear envelope modulation onto the transmit signal $RF_{OUT}$, despite operating the power amplifier 12 in a saturated mode. Because the current source 14 directly controls the supply current $I_{PA}$ it provides independent of supply voltage $V_{PA}$, changes in output loading, shown as $Z_{LOAD}$, of the power amplifier 12 do not change the supply current $I_{PA}$. Such changes in output loading might result from, for example, coupling changes from an antenna (not shown) connected to the power amplifier's output.

Operating the power amplifier 12 in this manner has significant advantages. Other techniques, such as controlling the supply voltage $V_{PA}$ of the power amplifier 12 may work well for certain types of power amplifiers 12, yet result in non-linearity of control for other amplifier types. As an example, certain types of field-effect transistor (FET) power amplifiers 12 afford reasonably linear control over a wide output power range or amplitude modulation range of the transmit signal $RF_{OUT}$. However, heterojunction bipolar transistor (HBT) power amplifiers 12 do not respond linearly under supply voltage modulation control, particularly at lower amplitudes of the transmit signal $RF_{OUT}$, and require explicit DC offset predistortion to compensate for the intrinsic offset voltage of the HBT as illustrated in FIG. 3.

Figure 3:
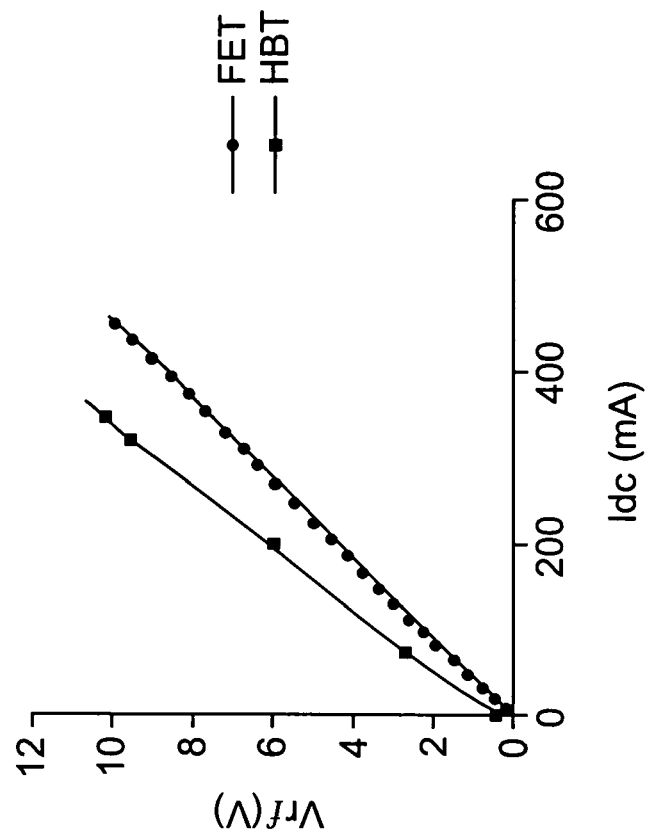
FIG. 3 is a diagram contrasting supply voltage control with supply current control, for both field-effect transistor (FET) and heterojunction bipolar transistor (HBT) power amplifier devices.
Figure 3:
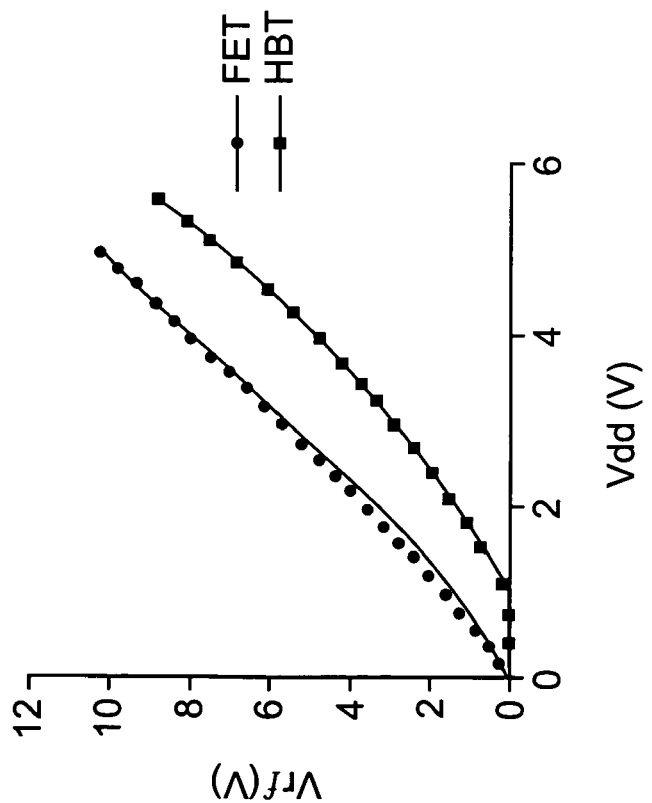

FIG. 3 contrasts supply voltage modulation with supply current modulation, in terms of saturated amplifier output linearity. The left graph plots the amplitude of $RF_{OUT}$ as a function of controlling the supply voltage $V_{PA}$ applied to the supply input of the power amplifier 12, for both FET and HBT implementations of the power amplifier 12. As shown, the FET implementation exhibits reasonably good linearity over the control range of supply voltage, but is not quite ideal. However, the HBT implementation exhibits substantial non-linearity at the lower operating voltages.

The right graph illustrates the same FET and HBT implementations for the power amplifier 12, but plots $RF_{OUT}$ amplitude as a function of supply current control as may be implemented using the current source 14. As shown, the linearity of the FET implementation is improved somewhat, but the linearity of the HBT implementation enjoys dramatic improvement.

Figure 4:
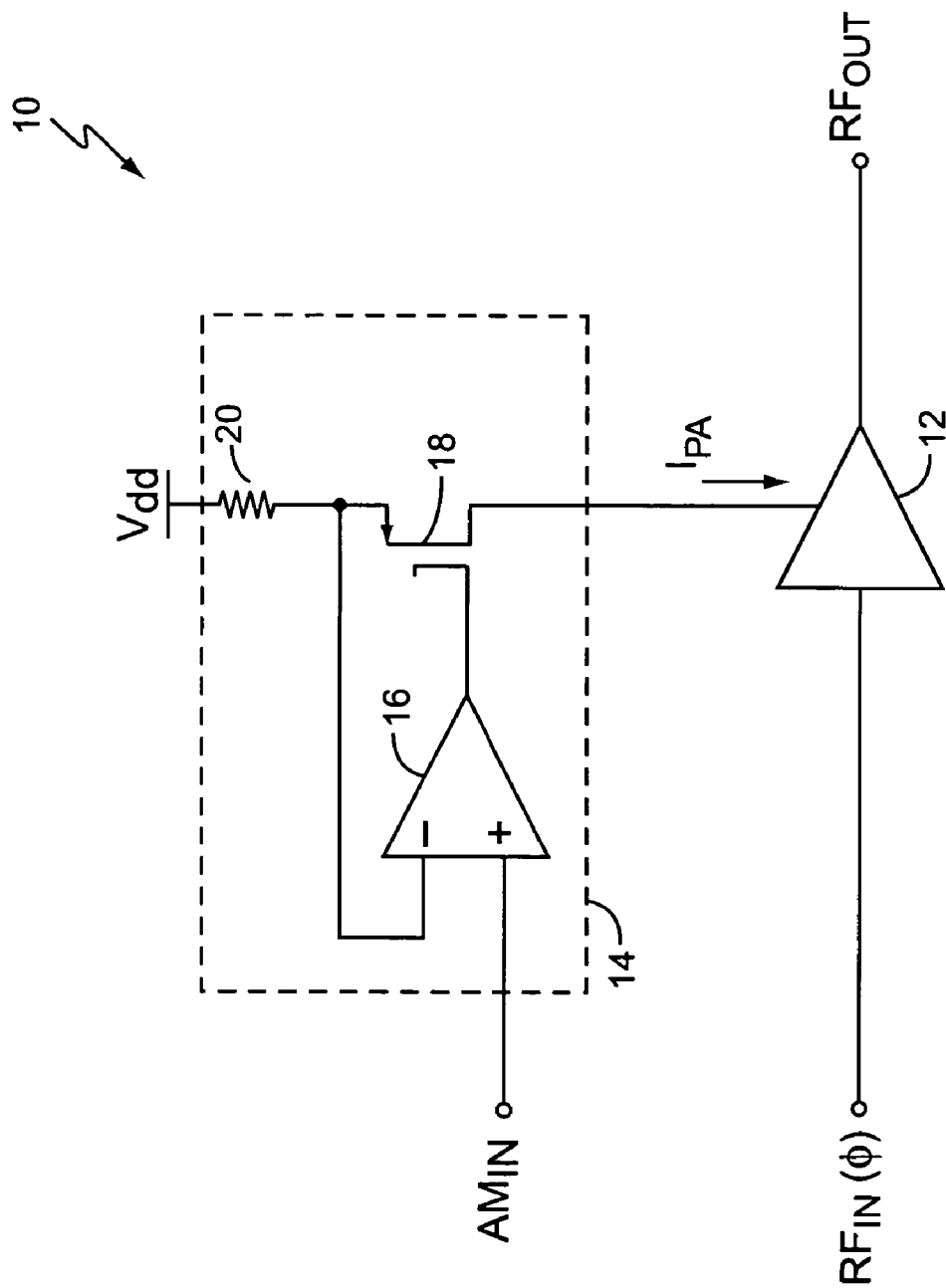
FIG. 4 is a diagram of an exemplary implementation of the amplifier circuit of FIG. 2.

FIG. 4 is a diagram of an exemplary implementation of the current source 14. The current source 14 comprises a control amplifier 16, a pass transistor 18, and a sense resistor 20. In this configuration, the current source 14 is realized as a closed-loop control circuit linearly responsive to a voltage-mode amplitude information signal $AM_{IN}$. The current source 14 controls the magnitude of the supply current $I_{PA}$ it provides to the power amplifier 12 as a function of the amplitude information signal $AM_{IN}$.

In operation, the $AM_{IN}$ signal is generated as, or converted to, a voltage-mode signal applied to the non-inverting input of the control amplifier 16, which may, for example, be an operational amplifier. The control amplifier 16 generates a control voltage based on the difference between the $AM_{IN}$ signal and a feedback signal taken from the supply current path of the power amplifier 12. The control voltage sets the gate bias for the pass transistor 16, which in turn sets the magnitude of the supply current $I_{PA}$ provided to the power amplifier 12.

The feedback signal is, in this implementation, developed as a function of the voltage drop across the sense resistor 20, which is disposed in series with the pass transistor 18 in the supply current path. The voltage drop across the sense resistor 20 is a direct function of the supply current $I_{PA}$ into the power amplifier 12. Thus, the $AM_{IN}$ signal controls the current source 14 such that it provides a supply current $I_{PA}$ to the power amplifier 12 that is modulated in accordance with signal variations in the $AM_{IN}$ signal.

The sense resistor 20 is generally chosen to have the lowest possible resistance that still yields workable feedback signal levels. The motivation for choosing relatively small resistance values for the sense resistor 20 arises from the desire to limit the amount of power dissipated by sensing supply current $I_{PA}$. However, in practice the desire for efficient current sensing balances against the need to develop adequate feedback signal levels at the control amplifier 16. An exemplary value of feedback resistor is in the range of 50 mΩ, but the particular value chosen in a given implementation depends on the expected magnitude range of the supply current $I_{PA}$, the gain versus frequency characteristics of the control amplifier 16, and the expected bandwidth of the amplitude information signal $AM_{IN}$.

The gain characteristics of the control amplifier 16 are a factor because it should be able to accurately generate the control voltage for the pass transistor 18 across the full bandwidth of the $AM_{IN}$ signal, even at the lowest levels of the feedback signal taken from the sense resistor 20. In a given implementation of the current source 14, the control amplifier 16 may be chosen based on the above identified factors, allowing an informed design comprise between cost and performance.

Figure 5:
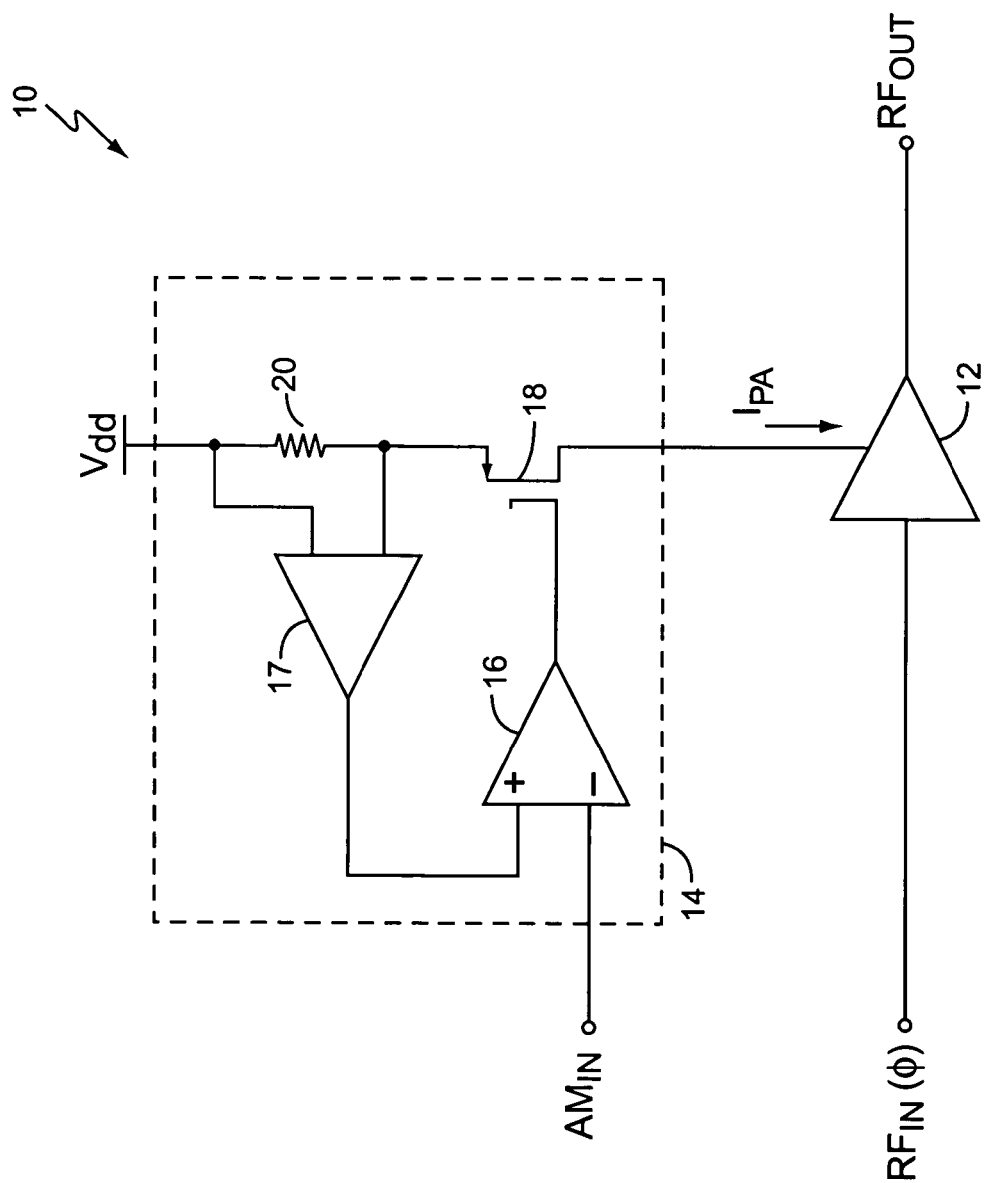
FIG. 5 is a diagram of an alternate exemplary implementation of the circuit of FIG. 4.

It may be that higher performance amplifier devices with high unity gain bandwidth provide acceptable performance for use as the control amplifier 16 within certain bandwidth limitations on the signal $AM_{IN}$. Cost considerations, as noted above, provide incentive for minimizing the performance requirements the control amplifier 16 and FIG. 5 illustrates one approach to reducing such requirements. A second amplifier 17 provides additional gain in the feedback loop of the control amplifier 16. By amplifying the differential signal taken across the sense resistor 20, amplifier 17 provides the control amplifier 16 with a larger control signal, which minimizes its gain requirements. That is, the feedback signal gain provided by amplifier 17 reduces the closed loop gain requirements of the control amplifier 16. This approach reduces the bandwidth requirements of both amplifiers 16 and 17.

Figure 6:
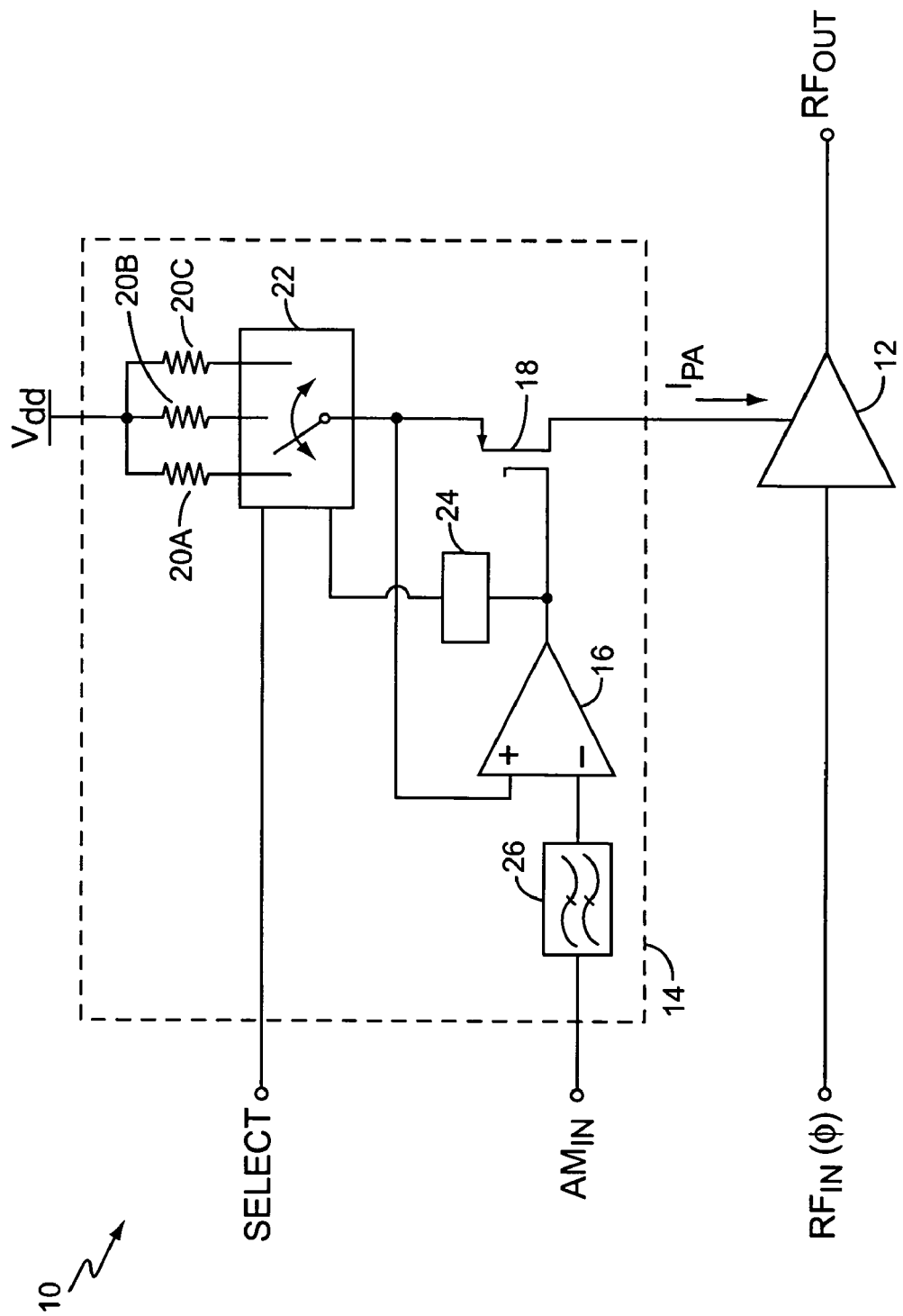
FIG. 6 is a diagram of the amplifier circuit of FIG. 4 with various, optional additions.

Besides enhancing the design in light of signal bandwidth considerations, other variations on the current source 14 of FIG. 4 or 5 incorporate additional operating features that may selectively added as needed or desired. FIG. 6 illustrates some of these optional features, including a plurality of sense resistors 20A . . . 20C, a corresponding sense resistor selection switch 22, optional selection signal logic 24, and an input filter 26.

As earlier noted, the sense resistor 20 provides the feedback signal based on developing a voltage drop proportional to the supply current $I_{P4}$. Reducing its resistance to a minimum value reduces the power lost in the sense resistor 20. Too small a resistance value will, however, yield undesirably low signal levels at the lower ranges of the supply current $I_{P4}$. One approach that satisfies these competing concerns is based on using a selected value sense resistor, e.g., 20A, 20B, or 20C, only within a given operating range of the supply current $I_{P4}$.

The sense resistor 20A may be made relatively large to insure good feedback signal levels at low magnitudes of supply current $I_{P4}$. Once the supply current $I_{P4}$ moves into a second magnitude range, the switch 22 may be made to change to sense resistor 20B, which may be scaled smaller in value with respect to the sense resistor 20A. Similarly, switch 22 may be used to select the sense resistor 20C, which can be made smaller still, once the supply current $I_{P4}$ moves into a third, perhaps maximum range. Of course, a smaller or greater number of sense resistors 20, with varying schemes for relative sizing of impedance values, may be used as needed.

An external selection signal may be used to control the switch 22 to selectively connect one of the set of sense resistors 20 into the supply current path. Such a signal might be generated by external logic. Logic generating the selection signal might be coordinated with known transmit power ranges. Alternatively, the current source 14 may incorporate a selection control circuit 24. The selection control circuit 24 could be configured, for example, as a simple magnitude comparison circuit, that generates a selection signal based on control voltage generated by the control amplifier 16. Effectively, then, the selection control circuit 24 may be configured to select the appropriate one of the sense resistors 20 based on the magnitude of the supply current $I_{P4}$. Variations to this general scheme might include combining two or more of the sense resistors 20 in parallel, extending the number of available resistor combinations.

The input filter 26 might be used where, for example, the amplitude information signal $AM_{IN}$ comes in as a digital bit stream. Oftentimes, so-called delta-sigma ($\Delta\Sigma$) converters generate a high bit rate output signal comprising a varying number of 1's and 0's that may be averaged to generate a proportionate analog signal. In this case, the input filter 26 may simply comprise a low-pass filter, implemented, for example, using a resistor-capacitor network. Note that some implementations requiring $AM_{IN}$ filtering may move the filter 26 from the amplifier circuit 10 into the integrated circuit (not shown) responsible for $AM_{IN}$ generation.

Figure 7:
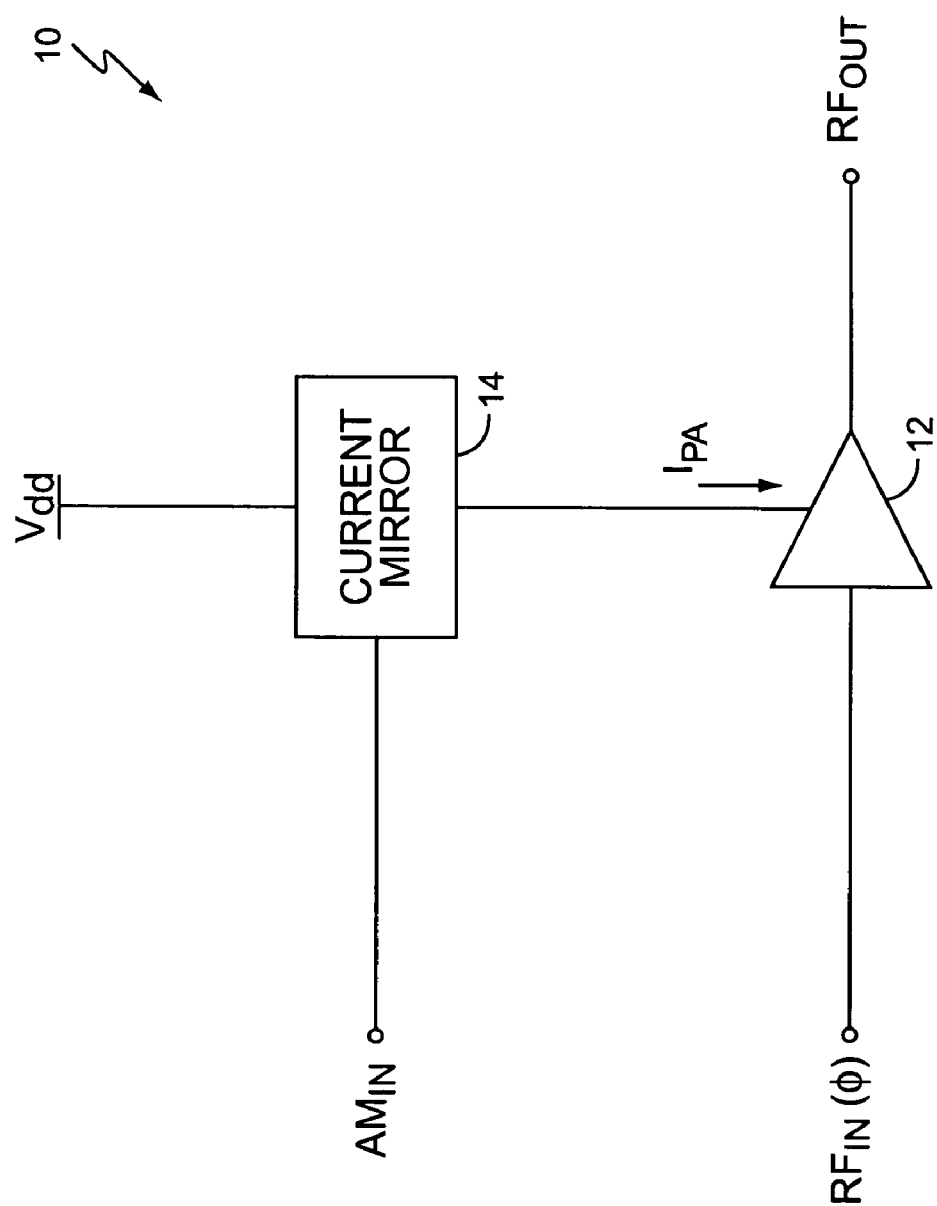
FIG. 7 is a diagram of a current-mirror implementation of the amplifier circuit of FIG. 2.

FIG. 7 is a general diagram of an alternative to the control circuit implementation illustrated in FIGS. 4 and 5. The current source 14 is based on a current mirror controlled in accordance with the amplitude information signal $AM_{IN}$. Specifically, the current source 14, configured as a current mirror, provides as its output the supply current $I_{P4}$ responsive to variations in the $AM_{IN}$ signal. This approach eliminates the need for amplifier current sensing via sense resistor 20.

Figure 8:
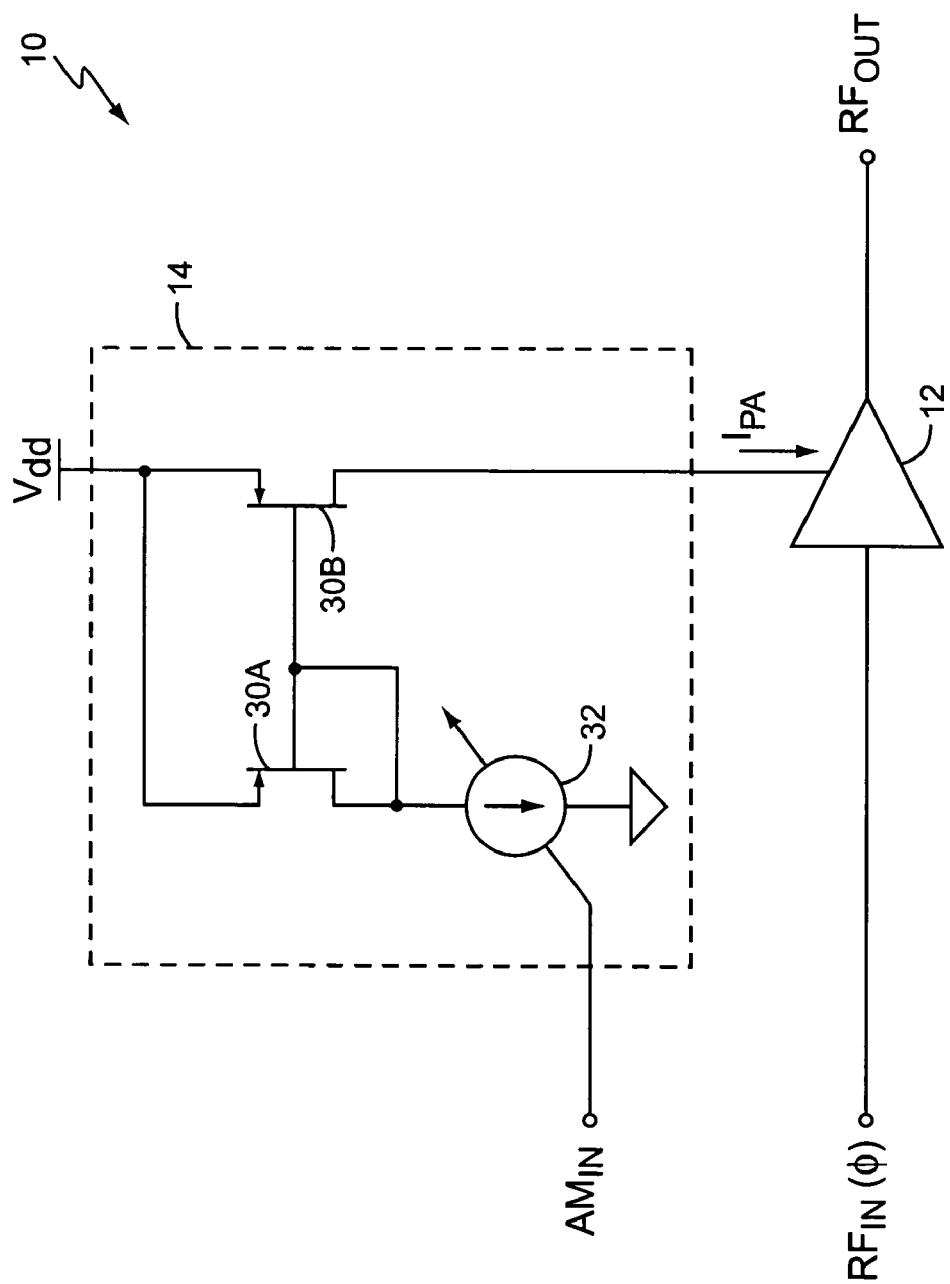
FIG. 8 is a diagram of an exemplary implementation of the current mirror of FIG. 7.

As is understood in the art, many variations exist for current mirror implementations. FIG. 8 illustrates an exemplary current mirror implementation for the current source 14. In this implementation, the current source 14 comprises transistors 30A and 30B, and a control current source 32. The transistor 30A defines a control current path, with the value of the control current set by the control current source 32 in accordance with the amplitude information signal $AM_{IN}$. The second transistor 30B has its base coupled to the base/drain terminals of the first transistor 30A, such that the supply current $I_{P4}$ provided by the second transistor 30B varies as a function of the $AM_{IN}$ signal. Essentially, the $AM_{IN}$ signal serves as the control current, and the supply current $I_{P4}$ is generated in proportion to the $AM_{IN}$ signal. The $AM_{IN}$ signal may be generated as a current mode signal and used to directly control the current through the first transistor 30A. This might obviate the need for the control current source 32.

In general, the first and second transistors 30A and 30B are implemented as a "matched pair." One approach to matching the transistors 30A and 30B is based on implementing them within the same integrated device, typically in close proximity to one another on the device die. By co-locating the transistors 30A and 30B, they enjoy close thermal coupling and are less likely to experience semiconductor process variations with respect to one another. The geometry of the transistors 30A and 30B may be scaled with respect to each other to achieve a desired current gain. The current gain sets the magnitude of the supply current $I_{P4}$ with respect to the magnitude of the control current, which is set in proportion to the $AM_{IN}$ signal.

Figure 9:
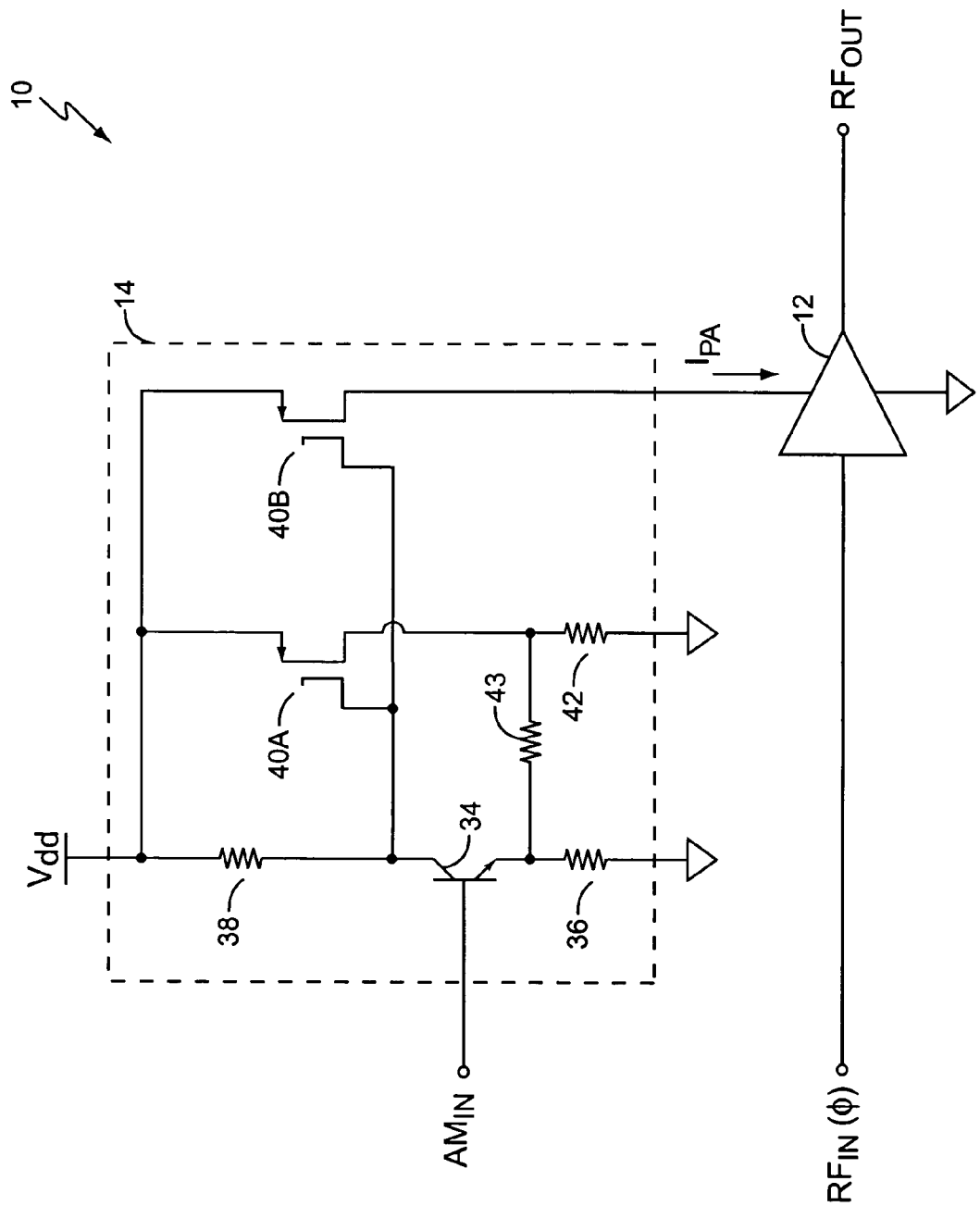
FIG. 9 is a diagram of an alternate exemplary implementation for the current mirror of FIG. 7.

FIG. 9 illustrates an alternate exemplary approach to a current mirror implementation of the current source 14. The illustrated circuit offers an advantageous approach to current amplitude modulation and minimizes many of the bandwidth considerations discussed in the context of FIGS. 4 and 5. In this implementation, the current source 14 comprises an input transistor 34 with an emitter degeneration resistor 36, a collector resistor 38, matched current mirror transistors 40A and 40B, and a fixed reference resistor 42 coupled to the emitter of transistor 34 via resistor 43. As illustrated, the input transistor 34 is a bipolar junction transistor (BJT), while transistors 40A and 40B are matched P-channel field-effect transistors (PFETs), however other transistor device types may be used in accordance with specific design needs.

The basis of operation is to develop a current through the fixed reference resistor 42 that is modulated as a function of the signal $AM_{IN}$, and then mirror that current into the power amplifier 12. In more detail, the signal $AM_{IN}$ drives the input transistor 34, which sinks a collector current proportional to $AM_{IN}$ through its collector load resistor 38. The voltage signal developed on the collector of transistor 34 drives the gates of matched transistors 40A and 40B. The transistor 40A sources current into the fixed reference resistor 42, the voltage across which is fed back to emitter of the transistor 34 to maintain its linear operation with respect to the $AM_{IN}$ signal. Thus, a voltage proportional to the signal $AM_{IN}$ is developed across the fixed reference resistor 42, the current through which is mirrored by the transistor 40B in the power amplifier 12.

The relative geometries of the matched transistor 40A and 40B may be set to achieve the desired scaling between the current through the fixed reference resistor 42 and the mirrored current ($I_{P4}$) into the power amplifier 12. Typically, the fixed reference resistor 42 has a value scaled to the nominal impedance of the power amplifier 12 at full rated power. This translates into a typical value of, for example, 1 K$\Omega$, for a nominal PA impedance of 2 $\Omega$.

The current source 14 illustrated in FIG. 9 may be particularly advantageous where the bandwidth of the amplitude modulation signal $AM_{IN}$ is high. For example, the amplitude modulation information of the $AM_{IN}$ signal may be in the range of 1.25 MHz to 1.5 MHz for GSM/EDGE applications, and may have similar bandwidth for other higher data rate third-generation (3G) wireless communication standards.

Of course, the current mirror implementation of the current source 14 shown in the various illustrations and discussed above may be extended to include various compensation circuits. While not shown, techniques for current mirror temperature compensation are well understood and may, if necessary, be employed in the current source 14. Further, other practical compensation measures may be included, such as AC compensation where needed, although this additional compensation is not illustrated.

Figure 10:
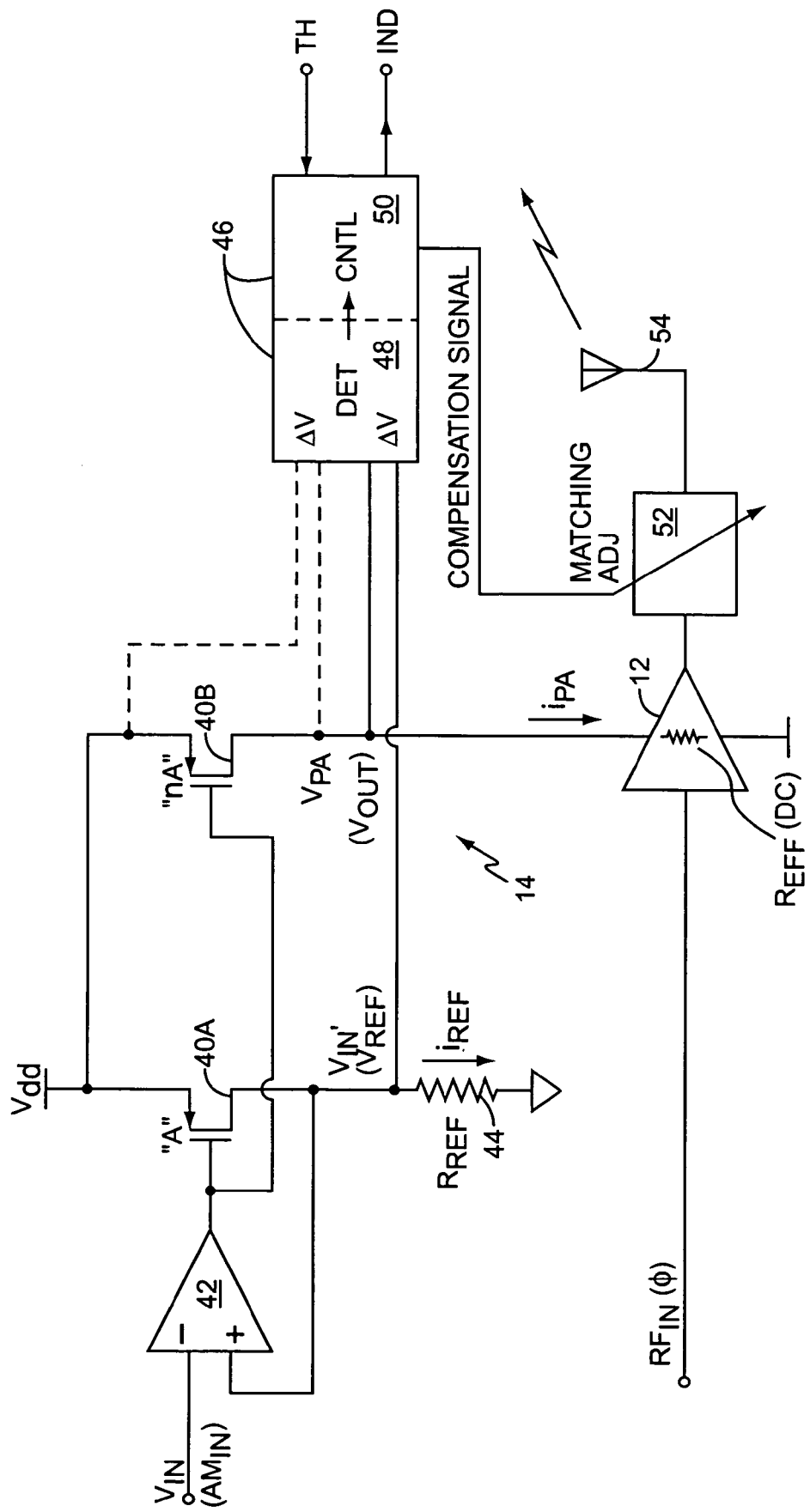
FIG. 10 is a diagram of an exemplary current mirror embodiment that includes a control circuit for sensing/compensating changing power amplifier DC impedance.

FIG. 10 illustrates yet another exemplary embodiment of current source 14, which senses and, optionally, compensates for, the changing effective DC resistance of power amplifier 12. In this embodiment, current source 14 comprises matched transistors 40A and 40B, an amplifier 42, which may be an operational amplifier, reference load resistor 44, and a detection/control circuit 46, which may function as a compensation circuit, and may be configured to include a detection circuit 48 and a control circuit 50 responsive thereto. Circuit 14 further may include an additional detection circuit 48, which can be used to sense the voltage across transistor 40B. Also illustrated in FIG. 10 are matching network 52 and antenna 54.

Functionally, the current source 14 provides a modulated supply current to the power amplifier 12 that is generated based on mirroring the (modulated) reference current from a first current mirror leg that includes transistor 40A, to a second current mirror leg that includes transistor 40B. In operation, amplifier 42 varies the gate drive of transistor 40A under closed loop control to maintain the $V_{IN}'$ node substantially at the $V_{IN}$ input signal, which can be generated as the desired amplitude information signal, $AM_{IN}$. Thus, the current $i_{REF}$ is a function of the input signal $V_{IN}$ and the size of load resistor 44, i.e., $i_{REF}=V_{IN}'/R_{REF}$. Since the same gate drive signal is applied to transistor 40B, it will mirror $i_{REF}$ in proportion to the geometric scaling of transistor 40B relative to transistor 40A. For example, if transistor 40A has geometry "A" and transistor 40B has geometry n×A, then the mirrored current $i_{PA}=n \times i_{REF}$.

The resulting output voltage $V_{PA}$ thus is a function of the modulated supply current $i_{PA}$ going into power amplifier 12 and the effective DC resistance, $R_{EFF}$, of power amplifier 12. If the nominal value of $R_{EFF}$ is about equal to $R_{REF}/n$, then $V_{PA}$ will about equal $V_{IN}'$. That is, the voltages in the current mirror will be balanced if the effective DC resistance of power amplifier 12 is about at its nominal value. However, to the extent that the effective DC resistance of power amplifier 12 changes during operation, $V_{PA}$ will mismatch $V_{IN}'$. That mismatch means that the operating voltages, e.g., gate-to-source, gate-to-drain, and drain-to-source voltages, of transistor 40B mismatch the operating voltages of transistor 40A. The discrepancies in transistor operating voltages compromise the current mirroring function of circuit 14, meaning that $i_{PA}$ generally will not maintain the desired proportionality to $i_{REF}$ over changing effective DC resistance of power amplifier 12.

More particularly, $i_{REF}$ is generated such that $V_{PA}$ remains within permissible operating voltage limits for a given value of Vdd for the nominal value of $R_{EFF}$. If $R_{EFF}$ significantly increases in value during transmit operations, then $V_{PA}=i_{PA} \times R_{EFF}$ can rise too high with respect to the operating voltage limits imposed by Vdd and the resulting output signal from power amplifier 12, $RF_{OUT}$, can be clipped. Such clipping results in undesirable signal distortions and accompanying spectral splatter.

The exemplary circuit 46 is configured to detect changes in the effective DC resistance of power amplifier 12 during operation, and to generate a control signal responsive thereto. The control signal, which also is referred to as a compensation or adjustment signal herein, is operative to adjust one or more operating parameters of a transmitter that includes RF power amplifier 12. While FIG. 10 illustrates the adjustment of impedance matching network 52 responsive to detected changes in the effective DC resistance of power amplifier 12, it should be understood that other parameters can be controlled in addition to controlling the matching impedance, or as an alternative thereto.

Circuit 46 can be configured to detect the changing effective DC resistance of power amplifier 12 based on detecting current mirror voltage imbalances, i.e., discrepancies between the reference voltage $V_{IN}'$ and the output voltage $V_{PA}$, as such discrepancies indicate that the effective DC resistance of power amplifier 12 has moved away from its nominal value of $R_{REF}/n$.

In addition to that detection method, or as an alternative thereto, circuit 46 can be configured to monitor the voltage difference across transistor 40B, as the difference between Vdd and $V_{PA}$ is, for a given value of $I_{PA}$, a function of the effective DC resistance of the power amplifier 12. This method of detection may be particularly advantageous for detecting a point at which increases in the effective DC resistance of power amplifier 12 risk causing $V_{PA}$ to rise toward the clipping limit imposed by Vdd.

In any case, the illustrated compensation method of using the compensation signal to adjust the impedance matching network 52 may be particularly advantageous in a mobile station. In a mobile station, the effective impedance of the station's transmit antenna generally changes as the mobile station's position relative to the user's body and or other proximate objects changes during a call. Thus, if the antenna's impedance changes and the resulting mismatch causes the effective DC resistance of the power amplifier 12 to move away from its nominal value, circuit 46 detects the resulting change in the effective DC resistance as indicated by $\Delta V=(V_{IN}'-V_{PA})$ and/or by $\Delta V=(Vdd-V_{PA})$.

Note that detection circuit 48 can be configured to generate a detection signal in proportion to the detected voltage difference(s), and the control circuit 50 can be configured to generate a compensation signal responsive thereto. For example, in a burst-mode transmission configuration, circuit 46 preferably is configured to sense changes during active signal transmission but defer its compensating adjustments until a time when there is no active transmission. For example, circuit 46 may detect voltage discrepancies between $V_{IN}'$ and $V_{PA}$ during a given transmit burst, and then update the compensation signal during the non-transmit time in advance of the next burst. Doing so avoids making compensation changes during an active transmission. Of course, some types of signal transmission may be tolerant of such changes during live transmission and it should be understood that the deferred adjustment approach described here is a non-limiting implementation detail.

Figure 11:
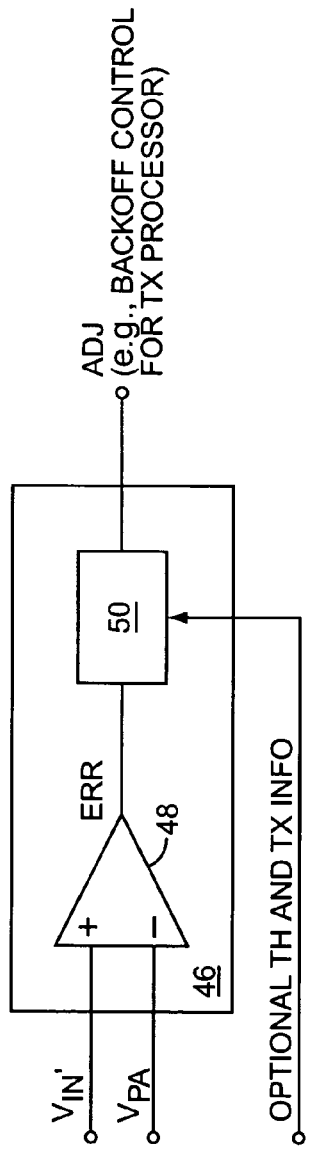
FIG. 11 is a diagram of an exemplary comparator/control circuit for use in the circuit of FIG. 10.

FIG. 11 illustrates an exemplary implementation of circuit 46, wherein the detection circuit 48 comprises a differential sensing circuit configured to generate a detection signal that is proportionate to the difference between its two signal inputs, which may be coupled directly or indirectly to the $V_{IN}'$ and $V_{PA}$ voltage signals, and or to the voltage difference across transistor 40B. Note that detection circuit 48 may include circuit elements not explicitly illustrated, such as filters to ensure that its detection bandwidth is configured accordingly for the amplitude modulation frequencies of the amplitude modulation information signal, $V_{IN}$. It may be desirable to roll-off the frequency response of circuit 48 relative to the modulation frequency such that its detection response is somewhat smoothed.

Alternatively, detection circuit 48 may be configured as a comparator that generates an asserted or de-asserted signal responsive to comparing $\Delta V = (V_{IN}' - V_{PA})$ and/or $\Delta V = (Vdd - V_{PA})$, to one or more defined thresholds. Thus, circuit 46 may receive optional threshold information for use in the comparison function. (Note that thresholding qualification also may be used in the proportional detection/control operations. For example, control signal assertion can be deferred until a detected voltage difference meets or exceeds a defined threshold.)

In any case, it should be understood that the control circuit 50 can be configured to generate the control signal in a format matched to its intended use. As such, the control signal may be analog or digital, and may be linear or non-linear, as needed. For example, FIG. 11 indicates that the compensation signal may be used to control a baseband transmit processor that is associated with generation of the signal to be transmitted. More particularly, the transmit processor can be configured to back-off (reduce) the amplitude of the amplitude information signal being used to generate the power amplifier's modulated supply current to avoid clipping. In this context, it should be understood that the control circuit 50 in fact may comprise a portion of the transmit signal processor, such that the detection circuit 48 provides the detection signal to the transmit signal processor as an indicator to tell it when it should back off to avoid clipping, for example.

Turning back to FIG. 10, the impedance matching circuit 52 may include one or more selectively coupled reactive devices, e.g., capacitors, inductors, etc., that are switched in and out of the matching circuit 52 to effect impedance matching control. In that context, the compensation signal may be generated as one, two, or a plurality of switch control signals. Alternatively, the impedance matching circuit 52 may include one or more variable elements, e.g., a varactor, in which case the compensation signal may be generated as a proportional analog control signal.

Figure 12:
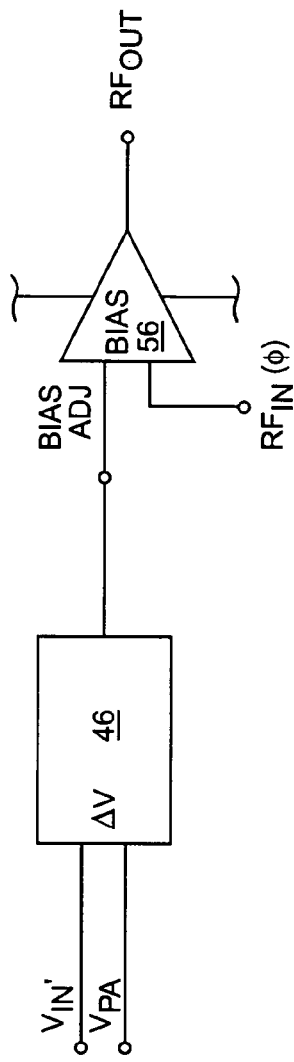
FIG. 12 is a diagram of the comparator/control circuit adapted for power amplifier bias control.

As another alternative, FIG. 12 depicts a control arrangement wherein circuit 46 generates a compensation signal that is used to change the bias of a power amplifier 56 responsive to detecting changes in the effective DC resistance of the power amplifier 56. It also should be understood that power amplifier 56 may be the same as the previously illustrated power amplifier 12, and that a different reference number is used primarily to highlight the bias control input.

Figure 13:
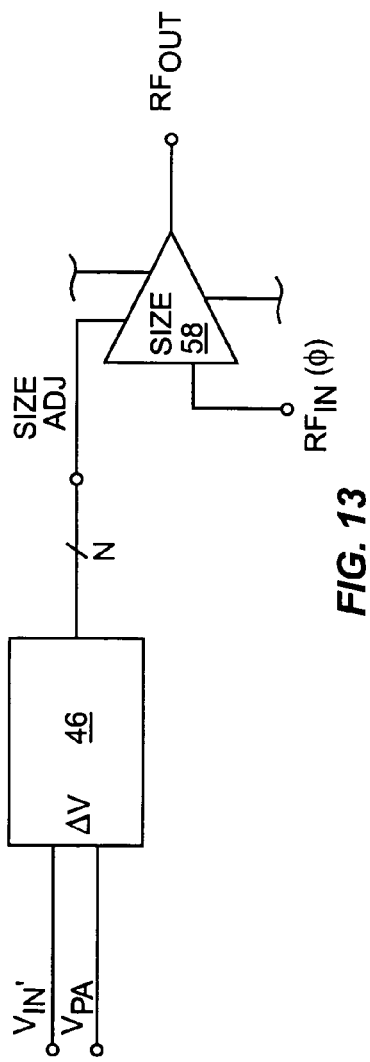
FIG. 13 is a diagram of the comparator/control circuit adapted for power amplifier "size" adjustment.

Similarly, FIG. 13 illustrates yet another exemplary compensation configuration wherein power amplifier 58 includes an explicit "size" control input that is driven responsive to the detection operations of circuit 46. Those skilled in the art will appreciate that power amplifier 58 may comprise a plurality of selectively enabled, parallel transistor elements that collectively function as a power amplifier. Changing the number of such elements that are activated at any one time changes the effective "size" and effective DC resistance of power amplifier 58.

Therefore, circuit 46 can be configured to generate an adjustment signal, e.g., a multi-bit binary signal, or a proportional analog signal, whose changing value changes the effective size of power amplifier 12. Thus, for example, if circuit 46 detects that $V_{PA}$ is rising relative to $V_{IN}'$, it can turn on more transistor elements to increase the effective size of power amplifier 58 and thereby bring its effective DC resistance back down toward the nominal value. Of course, if $V_{PA}$ began dropping relative to $V_{IN}'$, circuit 46 could turn off some number of transistor elements to raise the effective DC resistance back toward the nominal value.

Figure 14:
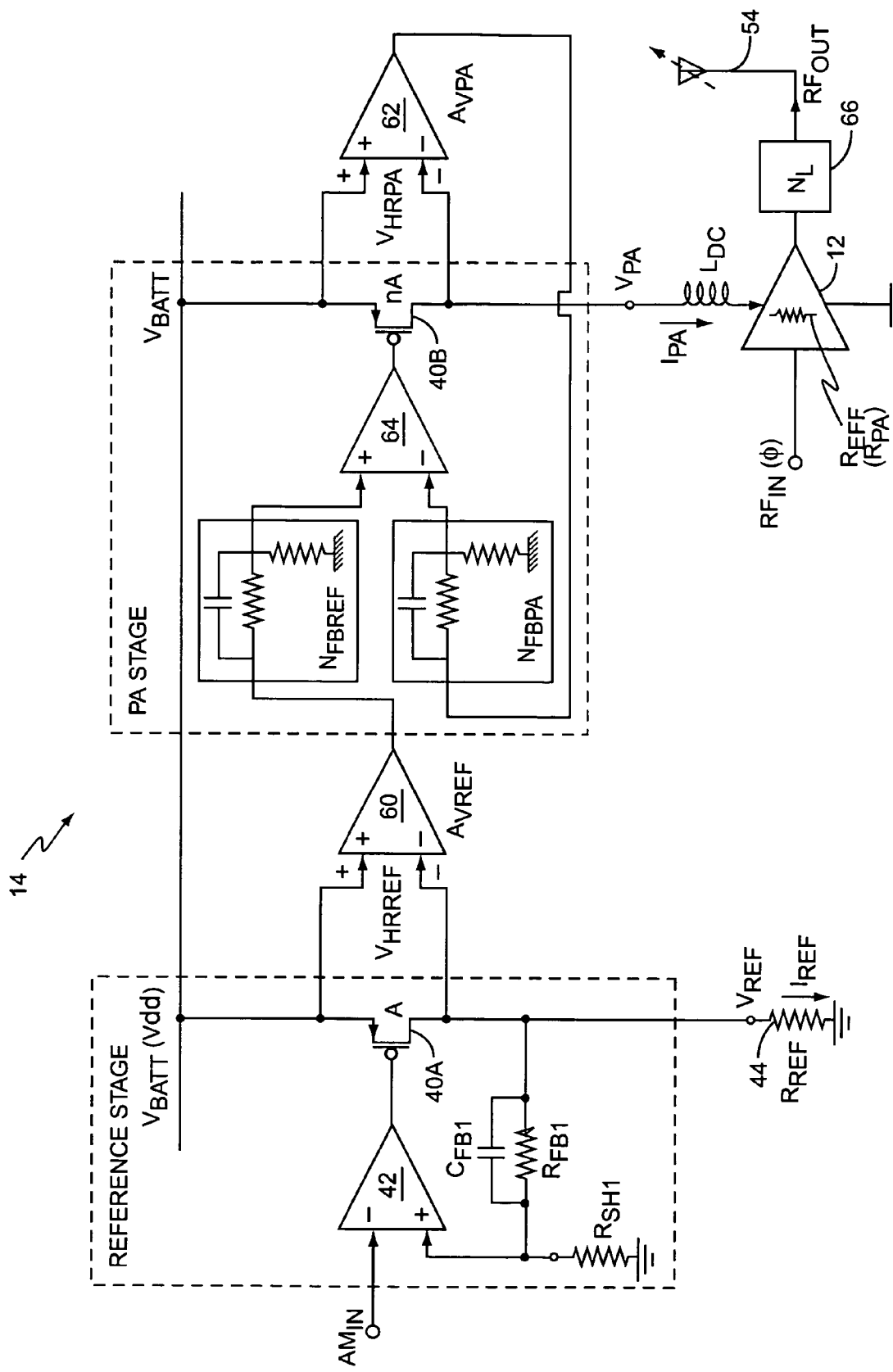
FIG. 14 is a diagram of an exemplary embodiment of a current mirror circuit operating under closed-loop compensation control.

One extension of the current mirroring circuit between reference load and PA load is embodied in FIG. 14. Broadly, the circuit illustrated in FIG. 14 supports a method of detecting and compensating for changing PA DC resistance wherein detecting a change in an effective DC resistance of the RF power amplifier comprises comparing a first voltage drop across a first pass transistor (transistor 40A) in a reference leg of a current mirror circuit 14 to a second voltage drop across a second pass transistor (transistor 40B) in an output leg of the current mirror circuit 14. Viewed from one perspective, the illustrated circuit compensates for changes in the effective DC resistance of the power amplifier 12 by varying the scaling ratio of the current mirror as a function of detecting those changes.

In this configuration, the first pass transistor 40A regulates a reference current into a reference load, and the second pass transistor 40B regulates the output supply current into the RF power amplifier 12, where the supply current is a mirrored version of said reference current. With this circuit, compensating transmitter operation responsive to the detection function comprises varying a drive signal to the second pass transistor 40B under closed-loop control such that the second voltage drop is maintained substantially equal to the first voltage drop.

In more detail, this closed loop example mirrors the current from a first stage, referred to as the "reference stage," which locks the current through reference resistor 44, $R_{REF}$, to a second stage, referred to as the "PA stage," which scales the reference current up by a nominal factor, n, through the load resistance $R_{PA}$ of PA 12. The voltage drop across the reference regulating transistor 40A, e.g., the drain-to-source drop if 40A is a FET, is sensed and amplified by a factor $A_{VREF}$ by amplifier 60, and compared against the corresponding voltage drop across the PA's regulating transistor 40B, which is sensed and amplified similarly by a factor $A_{V_{PA}}$ by amplifier 62. These sensed and amplified voltages, which represent the relative instantaneous headroom to the supply voltage upper rail of each branch, are then compared in amplifier 64 and used to lock the loop by driving the gate of transistor 40B, which regulates current into PA 12.

With respect to FIG. 10, then, it may be seen that amplifiers 60 and 62 function as detection circuit 48. In that same context, amplifier 64 function as the control circuit 50, wherein the error signal generated by amplifier 64 as the difference between the two sensed voltage drops serves as the gate drive signal to transistor 40B.

This configuration enables closed loop mirroring of the $I_{REF}$ current driving $R_{REF}$ into the PA DC resistance, $R_{PA}$, by a nominal factor n, for $R_{PA} = R_{REF}/n$. When the PA DC resistance varies due to the RF antenna impedance mismatch, the illustrated circuit automatically adjusts the gate or drive voltage of transistor 40B so that the headroom is maintained and locked to the reference transistor 40A. When the PA DC resistance deviates from $R_{REF}/n$, the current through the PA regulator transistor 40B adjusts such that $V_{BATT} - V_{PA} = V_{BATT} - V_{REF}$, or in other words, $$V_{REF} = V_{PA}, \text{ and } I_{PA} = V_{PA}/R_{PA} = I_{REF} \times (R_{REF}/R_{PA}).$$

The PA DC current, $I_{PA}$, is thereby a scaled version of the reference current, $I_{REF}$, proportional to the ratio of reference resistance (fixed and known) to PA DC resistance (variable and unknown). No matter what the value of the PA DC resistance $R_{PA}$, the headroom and linearity of the PA regulator is maintained while still modulating the DC current of the PA. As the PA DC current increases or decreases in response to changing antenna impedance, the forward available power out of the mismatched antenna will vary, but the maximum PA DC resistance is not allowed to force a headroom clipping distortion.

Thus, this embodiment enables a known reference current to be mirrored by a dynamically adjusting scale factor in closed loop to overcome variation that would otherwise degrade headroom and result in nonlinear clipping distortion of the regulated current to the PA. This closed loop continuous analog headroom mirroring is one embodiment of mirroring a reference current to the supply current of the PA without suffering headroom-clipping distortion. Similar variants of this embodiment may be implemented in a discrete manner, such that the feedback stages $N_{FBPA}$ and $N_{FBREF}$ may be adjusted in discrete steps in response to a known detection of headroom degradation, similar to the adjustment of PA bias, physical size, and/or output match described previously. (Note that each such feedback stage may provide gain control via a passive resistor/capacitor network as illustrated, but those skilled in the art will recognize that other feedback network configurations can be used, depending on the needs of the particular design at hand.)

Figure 15:
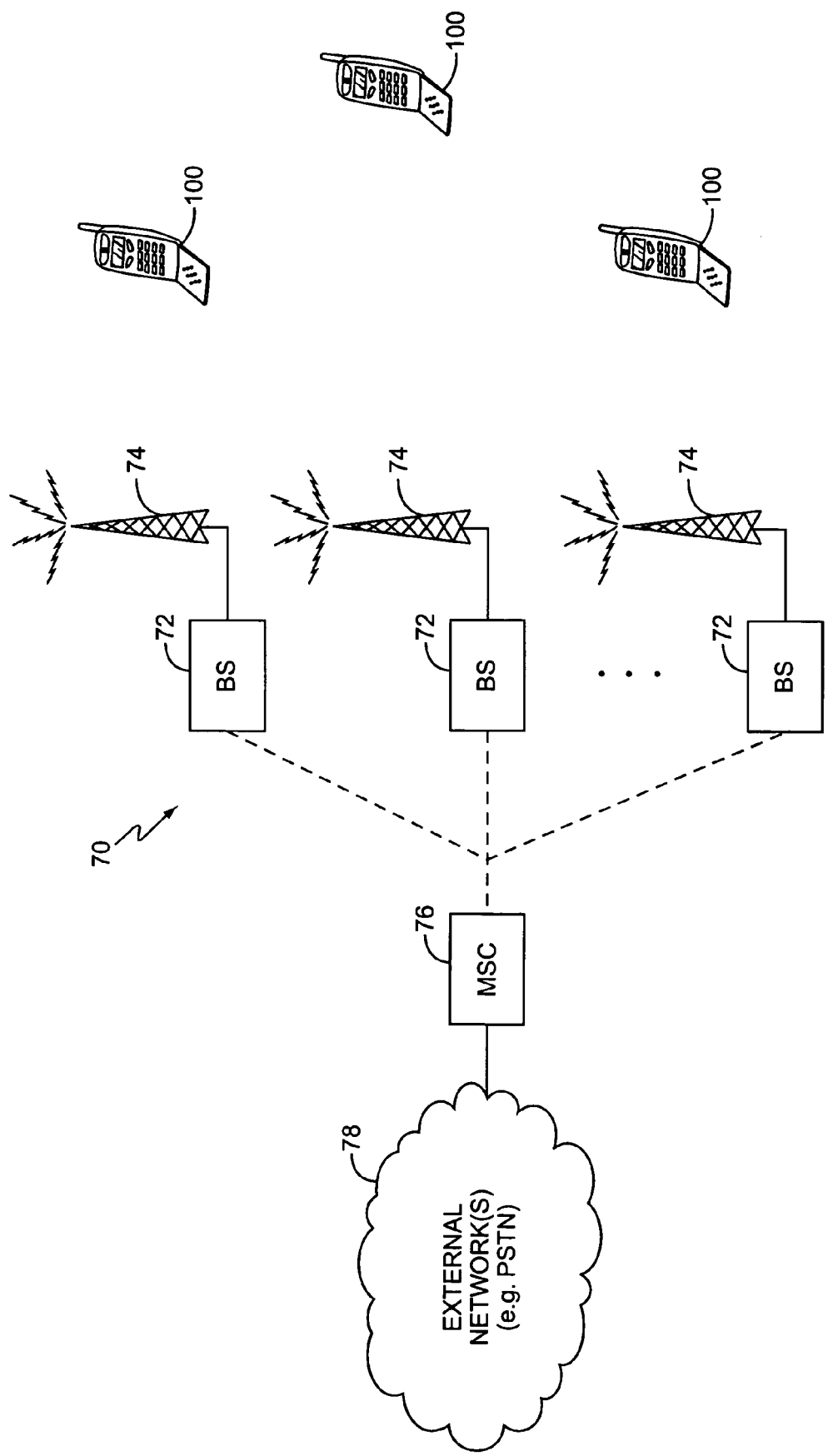
FIG. 15 is a diagram of an exemplary wireless mobile network.

With the above embodiments in mind, FIG. 15 illustrates an exemplary mobile network supporting wireless communications. The mobile network is generally referred to by the numeral 70, and includes one or more base stations 72, each with an associated receive/transmit antenna 74, one or more mobile switching centers (MSCs) 76 interfacing the base stations 72 with one or more external networks 78, and a plurality of mobile terminals 100. The mobile terminals 100 and, in some implementations, the base stations 72, may advantageously incorporate the amplifier circuit 10 introduced in FIG. 2 in any of its several embodiments.

Wireless signaling between the mobile terminals 100 and the base stations 72 support communications between the mobile terminal users and users of the external networks 78, as well as with other mobile terminal users. Each base station 72 supports communication and control traffic for mobile terminals 100 within the coverage area of its associated antenna(s) 74. In turn, the MSC 76 coordinates and controls the functions of each base station 72, as well as interfacing communications traffic between the various base stations 72 and the external networks 78. The external networks 78 may include but are not limited to the Public Switched Telephone Network (PSTN), the Internet, and various Integrated Services Digital Networks (ISDN).

Figure 16:
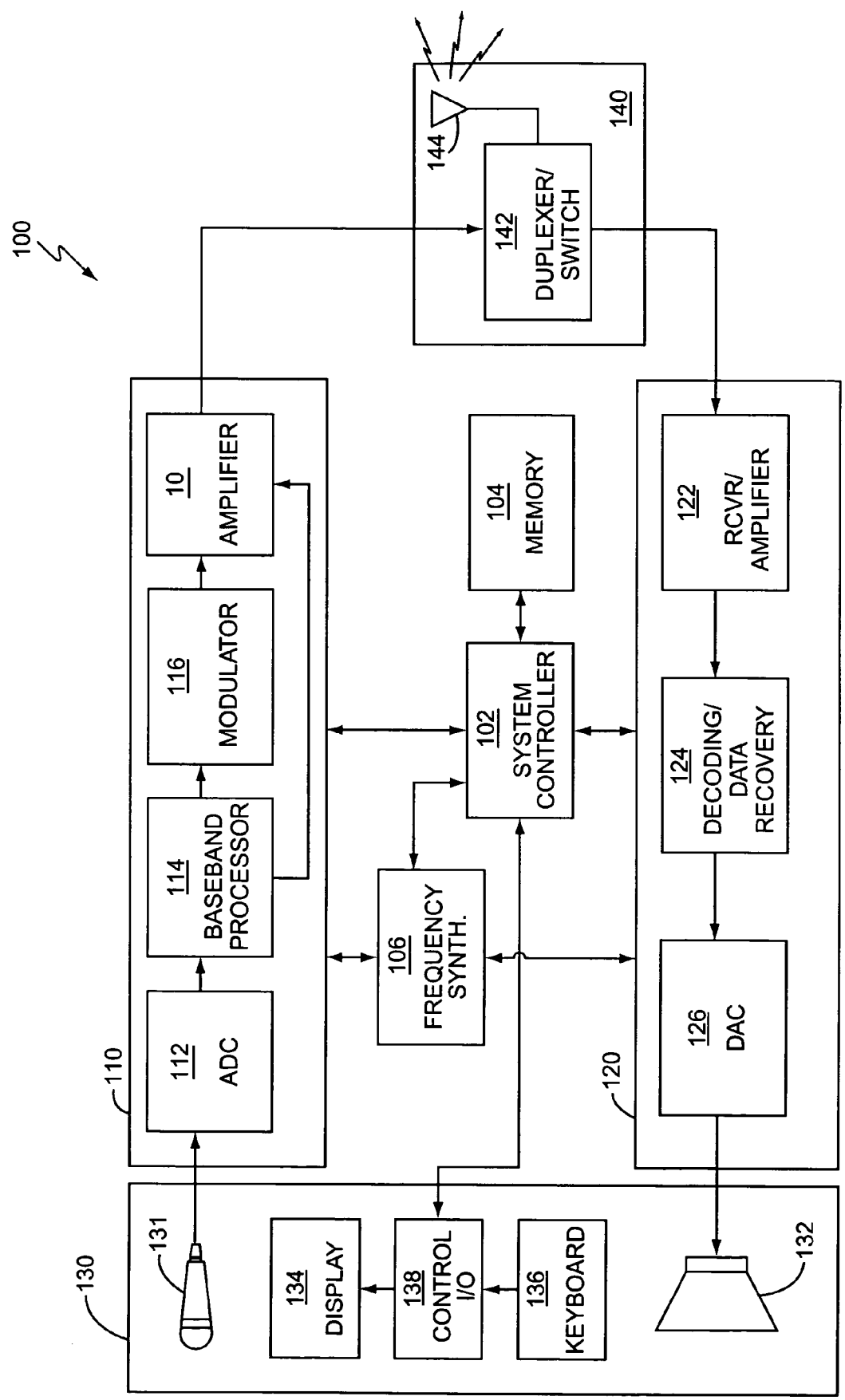
FIG. 16 is a diagram of a mobile terminal for use in the mobile network of FIG. 8.

FIG. 16 is a diagram of an exemplary implementation of the mobile terminal 100 used in the mobile network 70. The mobile terminal 100 includes a system controller 102, memory 104, a frequency synthesizer 106, a transmitter 110, a receiver 120, a user interface 130, and an antenna assembly 140.

In operation, the mobile terminal 100 sends and receives information via radio frequency signaling between it and its supporting base station 72. The system controller 102 is typically implemented as one or more microcontrollers (MCUs) that manage the user interface 130, and provide overall control of the mobile terminal 100. The memory 104 generally includes application software, default values for constants used in operation, and working space for data.

The user interacts with the mobile terminal 100 via the user interface 130. A microphone 131 converts user speech signals into a corresponding analog signal, which is provided to the transmitter 110 for subsequent conversion, processing, and transmission to the base station 72 via the antenna assembly 140. The receiver 120 receives signals from the base station 72 and extracts received audio information, e.g., speech from a remote user, and provides a resulting audio signal for driving a speaker 132 included in the user interface 130. The user interface 130 further includes a display 134 for providing visual information to the user, and a keypad 136 for accepting commands and data input from the user. The user interface 130 may include an I/O interface 138 for interfacing the display 134 and keypad 136 to the system controller 102. In short, the user interface 130 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna assembly 140, with the coupling circuit 142 providing signal isolation between received and transmitted signals. In some implementations, the coupling circuit 142 includes a receive/transmit switch to selectively connect either the transmitter 110 or the receiver 120 to the antenna 144. In other cases, the coupling circuit 142 includes a duplexer or other filter element to provide signal isolation during simultaneous receive and transmit operations.

Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 132.

The transmitter 110 is configured in accordance with the present invention and includes an analog-to-digital converter (ADC) 112, a baseband processor 114, a modulator 116, and the amplifier circuit 10 introduced earlier. In operation, the ADC 112 converts analog speech signals from the microphone 131 to corresponding digital values. The baseband processor 114 processes and encodes these digital values, providing error correction encoding and translation into a format suitable for the modulator 116. The baseband processor 114 may receive additional data for transmission from the system controller 102.

Depending upon the air interface standard used by the mobile terminal 100, the modulation scheme may require both amplitude and phase modulation of the transmit signal, denoted earlier as $RF_{OUT}$, radiated by the antenna 144. The baseband processor 114 typically encodes desired transmit information as a sequence of transmit symbols, with each symbol having a unique pairing of phase and amplitude values. The baseband processor 114 may split the phase and amplitude information into separate signals. Thus, it might generate a phase information signal, referred to as $\phi_{IN}$, synchronously with the amplitude information signal $AM_{IN}$, discussed earlier.

The modulator 116 uses the phase information signal $\phi_{IN}$ to modulate a carrier frequency signal, thus generating a carrier frequency signal having the desired phase modulation information. This modulated carrier frequency signal may serve as the RF input signal $RF_{IN}$ to the amplifier circuit 10. Note that the frequency synthesizer 106 may be used to generate a reference or carrier frequency signal for input to the modulator 116.

Thus, in this exemplary configuration, the amplifier circuit 10 receives the $RF_{IN}$ signal from the modulator 116 and the amplitude information signal $AM_{IN}$ (also referred to as $V_{IN}$ herein) from the baseband processor 114. The amplifier circuit 10 may be configured in accordance with any of the embodiments discussed earlier, or according to any variations thereof. The transmitter 110, using the power amplifier supply current modulation techniques available with the current source 14 included in the amplifier circuit 10, is able to impart highly linear amplitude modulation to the transmit signal ($RF_{OUT}$), which is radiated by the mobile terminal 100 via its antenna 144.

Note, too, that a matching network may be coupled between transmitter 110 and antenna 144 and may be adjustable in accordance with the discussion of FIG. 10. Of course, matching network adjustment, and/or PA bias or size adjustment, may not be implemented. For example, in one or more preferred embodiments, the closed loop current mirroring of FIG. 14 is implemented in amplifier circuit 10, such that clipping is avoided and highly linear amplitude modulation is maintained over changing antenna impedance.

The present invention may, of course, be carried out in other specific ways than those herein set forth with departing from the scope and essential characteristics of the invention. Indeed, the present invention presents a generalized way to substantially prevent phase shift changes in a transmitted signal arising from changing transmitter configurations. These configuration changes may arise from the need to operate in different transmit signal power ranges, or from the need to make other types of changes in transmit signal generation. The present embodiments are therefore to be construed in all aspects as illustrative and not restrictive, and all changes coming within the meaning and equivalency of the appended claims are embraced herein.

What is claimed is:

1. A method of compensating operation of a transmitter that includes av RF power amplifier being provided a modulated supply current, the method comprising:

generating the modulated supply current as a scaled version of a modulated reference current by mirroring the modulated reference current via a current mirror circuit and configuring the current mirror circuit such that a reference voltage generated by the modulated reference current flowing into a reference load will substantially match an output voltage generated by the modulated supply current flowing into an effective DC resistance of the RF power amplifier for a nominal effective DC resistance of the RF power amplifier;

detecting a change in the effective DC resistance of the RF power amplifier away from the nominal effective DC resistance of the RF power amplifier by detecting a voltage imbalance in the current mirror circuit; and compensating transmitter operation responsive to said detection.

2. The method of claim 1, wherein detecting a voltage imbalance in the current mirror circuit comprises detecting a difference between the reference voltage and the output voltage.

3. The method of claim 1, wherein compensating transmitter operation responsive to said detection comprises determining that the effective DC resistance of the RF power amplifier has increased and changing one or more operating parameters of the transmitter to offset the increase.

4. The method of claim 1, wherein compensating transmitter operation responsive to said detection comprises detecting that the effective DC resistance of the power amplifier has moved away from its nominal value, and changing one or more operating parameters of the transmitter to move the effective DC resistance back toward its nominal value.

5. The method of claim 1, wherein compensating transmitter operation responsive to said detection comprises changing an impedance matching circuit that couples the RF power amplifier to a transmit antenna to compensate for a detected change in the effective DC resistance of the RF power amplifier.

6. The method of claim 1, wherein compensating transmitter operation responsive to said detection comprises changing an effective device size of the RF power amplifier to compensate for a detected change in the effective DC resistance of the RF power amplifier.

7. The method of claim 1, wherein compensating transmitter operation responsive to said detection comprises changing an operating bias of the RF power amplifier to compensate for a detected change in the effective DC resistance of the RF power amplifier.

8. The method of claim 1, wherein detecting a change in the effective DC resistance of the RF power amplifier away from the nominal effective DC resistance of the RF power amplifier by detecting a voltage imbalance in the current mirror circuit comprises comparing a first voltage drop across a first pass transistor in a reference leg of the current mirror circuit to a second voltage drop across a second pass transistor in an output leg of the current mirror circuit, wherein said first pass transistor regulates the modulated reference current into the reference load, and wherein said second pass transistor regulates the modulated supply current into the RF power amplifier.

9. The method of claim 8, wherein compensating transmitter operation responsive to said detection comprises varying a drive signal to the second pass transistor under closed-loop control such that the second voltage drop is maintained substantially equal to the first voltage drop.

10. The method of claim 1, further comprising:

receiving an amplitude information signal representing desired amplitude modulations for the modulated supply current;

generating a control voltage signal proportional to the amplitude information signal; and generating the modulated reference current responsive to the control voltage signal.

11. A current modulation circuit for use with a RF power amplifier in a transmitter, the current modulation circuit comprising:

a current mirror circuit configured to provide a modulated supply current to the RF power amplifier based on mirroring a modulated reference current that is modulated responsive to an amplitude information signal;

a detection circuit configured to detect changes in an effective DC resistance of the RF power amplifier by detecting a voltage imbalance in the current mirror circuit and generating a detection signal responsive thereto; and a control circuit configured to compensate the transmitter responsive to the detection signal.

12. The current modulation circuit of claim 11, wherein the control circuit comprises a portion of a baseband transmit signal generator configured to reduce the amplitude information signal responsive to an increase in the effective DC resistance of the RF power amplifier as indicated by the detection signal.

13. The current modulation circuit of claim 12, wherein the detection signal is qualified by a threshold value, such that the control circuit does not reduce the amplitude information signal until the detection signal reaches the threshold value.

14. The current modulation circuit of claim 13, wherein the detection signal is configured to detect the voltage imbalance in the current mirror circuit by comparing a difference signal to the threshold value, said difference signal being generated based on a difference between the reference voltage arising from the modulated reference current and the output voltage arising from the modulated supply current.

15. The current modulation circuit of claim 11, wherein the detection circuit is configured to detect the voltage imbalance in the current mirror circuit by detecting a difference between the reference voltage and the output voltage.

16. The current modulation circuit of claim 15, wherein the control circuit is configured to generate a compensation signal operative to change an impedance matching circuit coupling the RF power amplifier to an antenna, so that a matching impedance value is changed as a function of detected changes in the effective DC resistance of the RF power amplifier.

17. The current modulation circuit of claim 15, wherein the control circuit is configured to generate a compensation signal operative to change an effective device size of the RF power amplifier, so that the effective device size of the RF power amplifier is changed as a function of detected changes in the effective DC resistance of the RF power amplifier.

18. The current modulation circuit of claim 15, wherein the control circuit is configured to generate a compensation signal operative to change an operating bias of the RF power amplifier, so that the operating bias is changed as a function of detected changes in the effective DC resistance of the RF power amplifier.

19. The current modulation circuit of claim 11, wherein the detection circuit is configured to detect the voltage imbalance in the current mirror circuit based at least in part on monitoring a voltage difference across a current mirroring transistor in an output leg of the current mirror circuit, wherein a minimum value of that voltage difference decreases with increases in the effective DC resistance of the RF power amplifier.

20. The current modulation circuit of claim 11, wherein the control circuit is configured to defer compensation of the transmitter until the detection signal reaches a defined threshold value.

21. The current modulation circuit of claim 11, wherein the control circuit is configured to monitor the detection signal as generated during an active transmission time, and update its compensation of the transmitter during a subsequent inactive transmission time.

22. The current modulation circuit of claim 11, wherein the detection circuit is configured to detect the voltage imbalance in the current mirror circuit by comparing a first voltage drop across a first pass transistor in a reference leg of the current mirror circuit to a second voltage drop across a second pass transistor in an output leg of the current mirror circuit, wherein said first pass transistor regulates the reference modulated current into the reference load, and wherein said second pass transistor regulates the modulated supply current into the RF power amplifier.

23. The current modulation circuit of claim 22, wherein the control circuit is configured to compensate the transmitter responsive to the detection signal by varying a drive signal to the second pass transistor under closed-loop control such that the second voltage drop is maintained substantially equal to the first voltage drop.

24. The current modulation circuit of claim 11, wherein the current modulation circuit further comprises:
   a first input to receive an amplitude information signal representing desired amplitude modulations for the modulated supply current;
   a first input circuit coupled to the first input and configured to generate a control voltage signal proportional to the amplitude information signal; and
   wherein a reference current leg of the current mirror circuit generates the modulated reference current responsive to the control voltage signal.

* * * * *